(12) United States Patent
Fukui et al.

(10) Patent No.: US 11,017,957 B2
(45) Date of Patent: *May 25, 2021

(54) DYE-SENSITIZED SOLAR CELL

(71) Applicant: SHARP KABUSHIKI KAISHA, Sakai (JP)

(72) Inventors: Atsushi Fukui, Sakai (JP); Tomohisa Yoshie, Sakai (JP); Kei Kasahara, Sakai (JP); Naoto Nishimura, Sakai (JP); Daisuke Toyoshima, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/898,108

(22) Filed: Jun. 10, 2020

(65) Prior Publication Data

US 2020/0303134 A1 Sep. 24, 2020

Related U.S. Application Data

(63) Continuation-in-part of application No. 16/321,816, filed as application No. PCT/JP2017/029088 on Aug. 10, 2017, now Pat. No. 10,727,412.

(30) Foreign Application Priority Data

Aug. 12, 2016 (JP) ................................ 2016-158766

(51) Int. Cl.
*H01G 9/20* (2006.01)
*H01L 51/00* (2006.01)

(52) U.S. Cl.
CPC ......... *H01G 9/2059* (2013.01); *H01G 9/2022* (2013.01); *H01L 51/0086* (2013.01)

(58) Field of Classification Search
CPC . H01L 51/005; H01L 51/0045; H01L 51/426; H01L 51/441; H01G 9/20; H01G 9/2022; H01G 9/2059

See application file for complete search history.

(56) References Cited

U.S. PATENT DOCUMENTS

| 6,150,605 A * | 11/2000 | Han .................... C09B 5/62 136/263 |
| 2009/0211639 A1 * | 8/2009 | Park .................... H01G 9/2072 136/262 |
| 2009/0242027 A1 | 10/2009 | Inoue et al. |
| 2014/0124025 A1 | 5/2014 | Park et al. |

FOREIGN PATENT DOCUMENTS

| CN | 104240962 A | 12/2014 |
| EP | 2037528 A1 | 3/2009 |
| JP | 2014-165049 A | 9/2014 |

OTHER PUBLICATIONS

Notice of Allowance dated Mar. 19, 2020 for U.S. Appl. No. 16/321,816.

* cited by examiner

*Primary Examiner* — Jayne L Mershon
(74) *Attorney, Agent, or Firm* — ScienBiziP, P.C.

(57) ABSTRACT

The dye-sensitized solar cell comprises a first electrode including a porous semiconductor layer supporting a dye; and a second electrode serving as a counter electrode of the first electrode. The second electrode includes a counter electrode conductive layer containing an absorbent supporting a dye that is the same as or different from the dye supported by the porous semiconductor layer.

6 Claims, 4 Drawing Sheets

DYE-SENSITIZED SOLAR CELL

TECHNICAL FIELD

The present disclosure relates to a dye-sensitized solar cell and a method for producing the same.

BACKGROUND ART

Solar cells are roughly classified based on the materials into three groups: silicon, compound, and organic solar cells. Silicon solar cells have high conversion efficiency, and solar cells using polysilicon are most widely used for power generation. A dye-sensitized solar cell (hereinafter, may be abbreviated as "DSC") is known as one of the organic solar cells. Although the conversion efficiency of DSCs is inferior to that of silicon solar cells, DSCs have an advantage that the manufacturing cost is lower than those in the cases of using inorganic semiconductors, as in silicon and compound solar cells, and have attracted attention in recent years. In addition, DSCs have an advantage that high power generation efficiency can be obtained even in a low-illuminance environment and have attracted attention also from this point of view.

However, dye-sensitized solar cells have a problem in durability. Accordingly, it has been investigated to improve the durability of sensitizing dyes (hereinafter, simply referred to as "dyes") (for example, PTL 1).

CITATION LIST

Patent Literature

PTL 1: Japanese Unexamined Patent Application Publication No. 2015-135922

SUMMARY OF INVENTION

Technical Problem

An effect of improving the durability of a dye-sensitized solar cell can be obtained by improving the durability of the dye. According to the study of the present inventors, a decrease in the performance of a dye-sensitized solar cell with time is caused not only by deterioration of the dye but also by desorption of the dye from the porous semiconductor layer.

Accordingly, an object of the present disclosure is to provide a dye-sensitized solar cell in which a decrease in the short-circuit current due to desorption of the dye from a porous semiconductor layer is prevented and a method for producing the dye-sensitized solar cell.

Solution to Problem

A dye-sensitized solar cell according to an embodiment of the present disclosure includes a first electrode including a porous semiconductor layer supporting a dye, a second electrode serving as the counter electrode of the first electrode, and an electrolytic solution filled between the first electrode and the second electrode. The second electrode includes a counter electrode conductive layer supporting the same dye as that supported by the porous semiconductor layer. The number of moles of the dye supported by the counter electrode conductive layer is 25% or more and 170% or less of the number of moles of the dye supported by the porous semiconductor layer.

In a certain embodiment, the counter electrode conductive layer contains carbon microparticles as absorbents. The carbon microparticles include carbon black having a specific surface area of 800 $g/m^2$ or more in an amount of 14 mass % or more. The carbon black has an average particle diameter of, for example, 10 nm or more and 100 nm or less, preferably 20 nm or more and 50 nm or less. Here, the average particle diameter is the arithmetic mean particle diameter determined from a transmission electron microscope (TEM) image.

In a certain embodiment, the carbon microparticles include graphite microparticles. The graphite microparticles have an average particle diameter of, for example, 1 μm or more and 10 μm or less, preferably 2 μm or more and 8 μm or less.

In a certain embodiment, the mass ratio between the carbon black and the graphite microparticles included in the carbon microparticles is about 4:6 or more and about 6:4 or less.

In a certain embodiment, the carbon microparticles have an average particle diameter of larger than 2 μm and 5 μm or less.

In a certain embodiment, the counter electrode conductive layer preferably has a thickness of 24 μm or more and 80 μm or less.

In a certain embodiment, the dye-sensitized solar cell further includes a substrate having transparency, and the first electrode and the second electrode are disposed on the substrate so as to face each other with a porous insulation layer therebetween. That is, the dye-sensitized solar cell in the certain embodiment is of a monolithic type.

In a certain embodiment, the dye-sensitized solar cell includes a first substrate having transparency and a second substrate disposed so as to face the first substrate. The first electrode is disposed on the first substrate, the second electrode is disposed on the second substrate, and the first electrode and the second electrode are arranged so as to face each other. The second substrate also preferably has transparency, but need not have transparency.

In a certain embodiment, the dye includes, for example, a ruthenium metal complex dye.

A method for producing a monolithic dye-sensitized solar cell according to an embodiment of the present disclosure includes a step a of preparing a substrate having transparency; a step b of forming the first electrode, the second electrode, and a porous insulation layer between the first electrode and the second electrode on the substrate; and a step c of, after the step b, supporting the dye simultaneously on the first electrode and the second electrode.

In a certain embodiment, the step c includes a step of immersing the substrate provided with the first electrode, the second electrode, and the porous insulation layer in a solution containing the dye.

Advantageous Effects of Invention

According to embodiments of the present disclosure, provided are a dye-sensitized solar cell in which a decrease in the short-circuit current due to desorption of the dye from a porous semiconductor is prevented and a method for producing the dye-sensitized solar cell.

DESCRIPTION OF EMBODIMENTS

Figure 1:
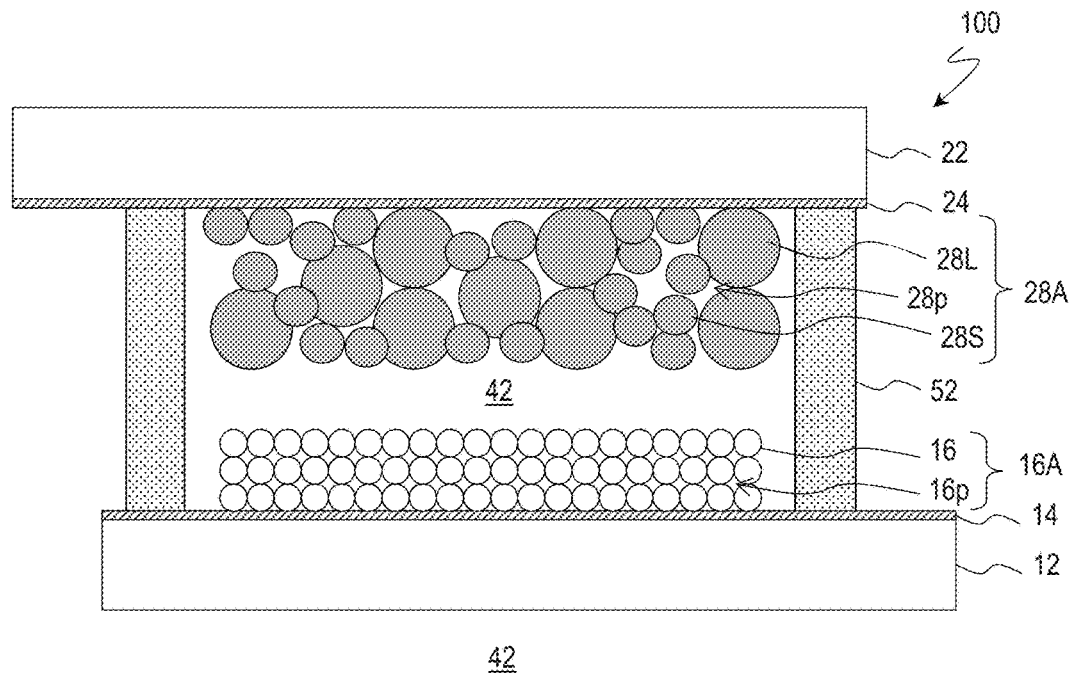
FIG. 1 is a schematic cross-sectional view of DSC 100 according to Embodiment 1.

A dye-sensitized solar cell according to an embodiment of the present disclosure includes a first electrode including a porous semiconductor layer supporting a dye, a second electrode serving as the counter electrode of the first electrode, and an electrolytic solution filled between the first electrode and the second electrode. The first electrode at least includes the porous semiconductor layer supporting a dye and may further include a conductive layer. The first electrode is also called a photoelectrode. The second electrode is an electrode functioning as the counter electrode of the photoelectrode and may be simply referred to as a counter electrode. The counter electrode at least includes a counter electrode conductive layer and may further include a catalyst layer. The counter electrode conductive layer may also serve as the catalyst layer. In a module in which a plurality of dye-sensitized solar cells (may be referred to as "unit cells" or simply "cells") are integrated, for example, cells adjacent to each other are electrically connected in series or in parallel. On this occasion, for example, the photoelectrode of one cell is connected to the counter electrode of the other cell by sharing a transparent conductive layer disposed on the substrate. In a dye-sensitized solar cell according to an embodiment of the present disclosure, the second electrode includes a counter electrode conductive layer supporting the same dye as that supported by the porous semiconductor layer. The number of moles of the dye supported by the counter electrode conductive layer is 25% or more and 170% or less of the number of moles of the dye supported by the porous semiconductor layer.

Accordingly, in a dye-sensitized solar cell according to an embodiment of the present disclosure, even if the dye of the first electrode is desorbed from the porous semiconductor layer, the dye is supplied from the counter electrode conductive layer of the second electrode and is adsorbed to the first electrode to prevent a decrease in the short-circuit current due to desorption of the dye from the porous semiconductor. The counter electrode conductive layer includes a material (hereinafter, referred to as "adsorbent") that adsorbs and supports a sufficient amount of the dye. In addition, the material as the adsorbent of the counter electrode conductive layer can also desorb the dye. That is, the adsorbent included in the counter electrode conductive layer can absorb and desorb a dye (depending on the concentration of the dye in the electrolytic solution). The adsorbent is preferably carbon microparticles (powder). Here, the term "carbon microparticles" is used as a meaning encompassing carbon black and graphite microparticles. The term graphite microparticles indicates that 70 vol % or more of the microparticles have a graphite structure. In the carbon black, less than 70 vol % of the microparticles have a graphite structure, and the remainder is amorphous, typically 80 vol % or more of the microparticles are amorphous.

The structure of the dye-sensitized solar cell according to an embodiment of the present disclosure may have any known structure. In addition, a module can also be formed by integrating a plurality of the dye-sensitized solar cells (cells) through electrical connection in series and/or in parallel.

The structures of DSC 100 and DSC 200 used in experimental examples (Examples 1 to 7 and Comparative Examples 1 to 7) will now be described with reference to drawings.

FIG. 1 shows a schematic cross-sectional view of DSC 100. DSC 100 includes a substrate (for example, a glass substrate) 12 having transparency, a transparent conductive layer 14 disposed on the substrate 12, and a porous semiconductor layer 16A disposed on the transparent conductive layer 14. The porous semiconductor layer 16A includes semiconductor microparticles 16 and pores 16$p$ and supports a dye (not shown).

DSC 100 further includes a substrate (for example, a glass substrate) 22 having transparency, a transparent conductive layer 24 disposed on the substrate 22, and a counter electrode conductive layer 28A disposed on the transparent conductive layer 24. An electrolytic solution (electrolyte) 42 is filled between the porous semiconductor layer 16A and the counter electrode conductive layer 28A. The electrolytic solution 42 is sealed in the gap between the substrate 12 and the substrate 22 with a sealing part 52. The electrolytic solution 42 contains, for example, I$^-$ and I$^{3-}$ as mediators (redox couple). The sealing part 52 is formed using a light curing resin or a heat curing resin.

The counter electrode conductive layer 28A of DSC 100 according to an embodiment of the present disclosure supports the same dye as that supported by the porous semiconductor layer. The adsorbent supporting the dye is, for example, carbon microparticles. The counter electrode conductive layer 28A includes, for example, carbon microparticles 28L and 28S and pores 28$p$. The carbon microparticles 28S have a particle diameter smaller than that of the carbon microparticles 28L.

The carbon microparticles 28S are, for example, carbon black having a specific surface area of 800 g/m$^2$ or more. The counter electrode conductive layer 28A contains carbon microparticles 28S in an amount of 14 mass % or more. That is, the mass of the carbon microparticles 28S relative to the total mass of the carbon microparticles 28S and 28L constituting the counter electrode conductive layer 28A is 14 mass % or more. The carbon black has an average particle diameter of, for example 10 nm or more and 100 nm or less, preferably 20 nm or more and 50 nm or less.

The carbon microparticles 28L are, for example, graphite microparticles. The graphite microparticles have an average particle diameter of, for example, 1 μm or more and 10 μm or less, preferably 3 μm or more and 8 μm or less.

The carbon black microparticles 28S have a high ability of adsorbing a dye, and the graphite microparticles 28L have a low ability of adsorbing a dye. Accordingly, the ability of adsorbing a dye of the counter electrode conductive layer 28A can be controlled by adjusting the ratio between the carbon microparticles 28S and the carbon microparticles 28L. For example, the mass ratio between the carbon black microparticles 28S and the graphite microparticles 28L contained in the entire carbon microparticles is about 4:6 or more and 6:4 or less. On this occasion, the carbon microparticles contained in the counter electrode conductive layer 28A have an average particle diameter of, for example, larger than 2 μm and 5 μm or less. The counter electrode conductive layer 28A has a thickness of, for example, 24 μm or more and 80 μm or less.

Figure 2:
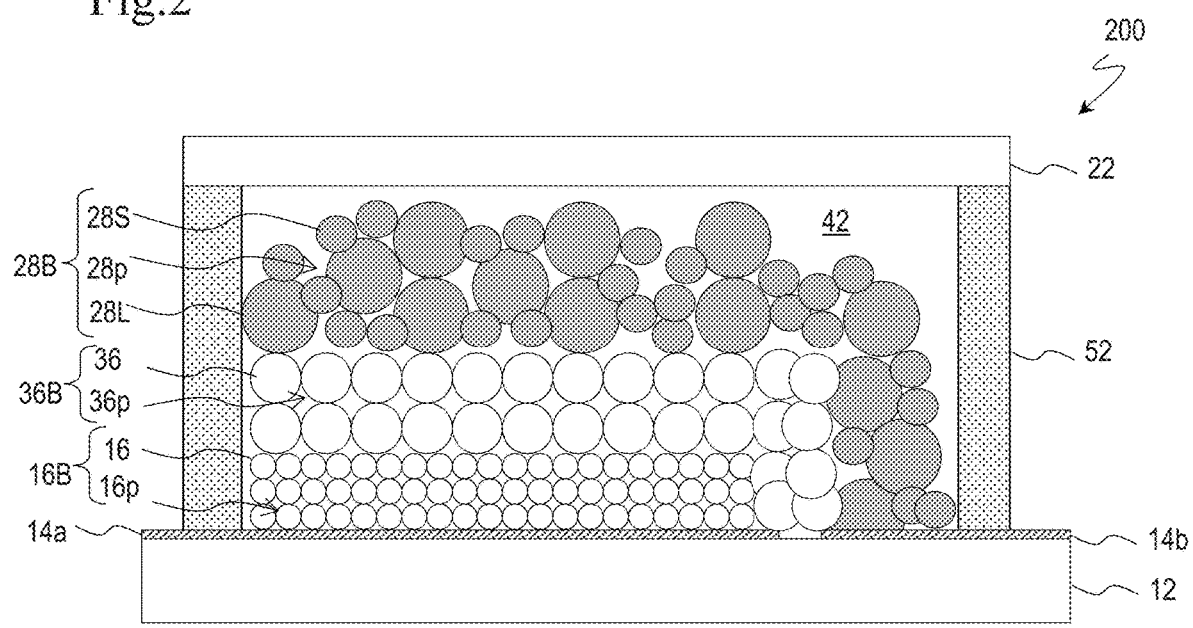
FIG. 2 is a schematic cross-sectional view of DSC 200 according to Embodiment 2.

FIG. 2 is a schematic cross-sectional view of DSC 200. DSC 200 is a monolithic DSC. DSC 200 includes a transparent conductive layer 14a disposed on a transparent substrate 12, a porous semiconductor layer 16B disposed on the transparent conductive layer 14a. A porous insulation layer 36B is disposed on the porous semiconductor layer 16B so as to cover the entire porous semiconductor layer 16B, and a counter electrode conductive layer 28B is further disposed on the porous insulation layer 36B. The porous semiconductor layer 16B and the counter electrode conductive layer 28B are disposed so as to face each other with the porous insulation layer 36B therebetween. The counter electrode conductive layer 28B is connected to a transparent conductive layer 14b disposed on the transparent substrate 12. The transparent conductive layer 14a and the transparent conductive layer 14b are insulated from each other on the transparent substrate 12.

DSC 200 also has a structure in which an electrolytic solution 42 is sealed in the gap between the substrate 12 and a substrate 22 with a sealing part 52.

As the transparent substrates 12, 22, for example, glass substrates can be used. However, the transparent substrates 12, 22 may each be formed with any material that can substantially transmit light having a wavelength showing effective sensitivity to a dye described later and do not necessarily have transparency against light in the entire wavelength range. The transparent substrates 12, 22 each have a thickness of, for example, 0.2 mm or more and 5.0 mm or less. The substrate 22 need not have transparency.

As the materials of the substrates 12, 22, many substrate materials that are usually used in solar cells can be widely used. For example, glass substrates such as soda glass, fused quartz glass, and crystal quartz glass or heat resistant resin plates such as flexible films can be used. As the flexible films, for example, tetraacetyl cellulose (TAC), polyethylene terephthalate (PET), polyphenylene sulfide (PPS), polycarbonate (PC), polyacrylate (PA), polyetherimide (PEI), phenoxy resin, and Teflon (registered trade mark) can be used.

The transparent conductive layers 14, 14a, 14b are each made of a material having conductivity and transparency. As the material, for example, at least one selected from the group consisting of indium-tin composite oxide (ITO), tin oxide ($SnO_2$), fluorine-doped tin oxide (FTC), and zinc oxide (ZnO) can be used. The transparent conductive layers 14, 14a, 14b each have a thickness of, for example, 0.02 μm or more and 5.00 μm or less. A lower electric resistance of the transparent conductive layer 14 is preferred, for example, an electric resistance of 40 Ω/sq or less is preferred.

The porous semiconductor layers 16A, 16B are each made of a photoelectric conversion material. As the material, for example, at least one selected from the group consisting of titanium oxide, zinc oxide, tin oxide, iron oxide, niobium oxide, cerium oxide, tungsten oxide, barium titanate, strontium titanate, cadmium sulfide, lead sulfide, zinc sulfide, indium phosphide, copper-indium sulfide ($CuInS_2$), $CuAlO_2$, and $SrCu_2O_2$ can be used. Titanium oxide is preferably used from the viewpoint of the high stability and the band gap size thereof.

As the titanium oxide, for example, anatase titanium oxide, rutile titanium oxide, amorphous titanium oxide, various narrowly defined titanium oxides such as metatitanic acid and orthotitanic acid, titanium hydroxide, and hydrous titanium oxide can be used alone or as a mixture. Although two types of crystalline titanium oxides, anatase and rutile titanium oxides, can be formed depending on the manufacturing method and thermal history, the crystalline titanium oxide is generally of anatase type. As the titanium oxide, it is preferable to use titanium oxide having a high content of the anatase type, for example, a content of 80% or more of the anatase type, from the viewpoint of dye-sensitization.

The crystal system of the semiconductor may be either monocrystalline or polycrystalline, but is preferably polycrystalline from the viewpoint of stability, ease of crystal growth, and manufacturing cost, and it is preferable to use polycrystalline semiconductor microparticles in a nano scale or micro scale. Accordingly, the raw materials of the porous semiconductor layers 16A, 16B are preferably titanium oxide microparticles. The titanium oxide microparticles can be produced by, for example, a liquid-phase method, such as a hydrothermal synthesis method or a sulfuric acid method, or a gas-phase method. The microparticles can also be produced by high temperature hydrolysis of a chloride developed by Degussa-Hulls AG.

As the semiconductor microparticles, a mixture of microparticles made of the same or different semiconductor compounds having two or more different particle diameters may be used. It is conceived that the semiconductor microparticles having a large particle diameter scatter incident light and thereby contribute to an improvement in light capture rate and that the semiconductor microparticles having a small particle diameter increase adsorption points and thereby contribute to an improvement in the adsorbed amount of the dye.

When the semiconductor microparticles used are composed of microparticles having different particle diameters, the ratio of the average particle diameters between the microparticles is preferably 10 times or more. The average particle diameter of the microparticles having a large particle diameter is, for example, 100 nm or more and 500 nm or less. The average particle diameter of the microparticles having a small particle diameter is, for example, 5 nm or more and 50 nm or less. When the semiconductor microparticles used are composed of different semiconductor compounds, it is effective to reduce the diameter of the particles made of a semiconductor compound having strong adsorption.

The porous semiconductor layers 16A, 16B each have a thickness of, for example, 0.1 μm or more and 100.0 μm or less, and each preferably have a specific surface area of, for example, 10 $m^2$/g or more and 200 $m^2$/g or less.

As the dyes supported by the porous semiconductor layers 16A, 16B and the counter electrode conductive layers 28A, 28B, one or more selected from a variety of organic dyes and metal complex dyes having absorption in the visible light region or the infrared light region can be selectively used.

The organic dye can be, for example, at least one selected from the group consisting of azo dyes, quinone dyes, quinoneimine dyes, quinacridone dyes, squarylium dyes, cyanine dyes, merocyanine dyes, triphenylmethane dyes, xanthene dyes, porphyrin dyes, perylene dyes, indigo dyes, and naphthalocyanine dyes. The absorption coefficient of an organic dye is generally higher than that of a metal complex dye, which takes a form in which a molecule is coordinate-boned to a transition metal.

The metal complex dye is constituted by coordinate-bonding a metal to a molecule. The molecule is, for example, a porphyrin dye, a phthalocyanine dye, a naphthalocyanine dye, or a ruthenium dye. The metal is, for example, at least one selected from the group consisting of Cu, Ni, Fe, Co, V, Sn, Si, Ti, Ge, Cr, Zn, Ru, Mg, Al, Pb, Mn, In, Mo, Y, Zr, Nb, Sb, La, W, P t, TA, Ir, Pd, Os, Ga, Tb, Eu, Rb, Bi, Se, As, Sc, Ag, Cd, Hf, Re, Au, Ac, Tc, Te, and Rh. The metal complex dye to be used is preferably a complex in which a metal is coordinated to a phthalocyanine dye or a ruthenium dye, and particularly preferably a ruthenium metal complex dye.

As the ruthenium metal complex dye, for example, commercially available ruthenium metal complex dyes, such as Ruthenium 535 dye, Ruthenium 535-bis TBA dye, and Ruthenium 620-1H3 TBA dye (trade names, manufactured by Solaronix SA) can be used.

The porous semiconductor layers 16A and 16B may each support co-adsorbent. When the co-adsorbent is included in the porous semiconductor layers 16A and 16B, the co-adsorbent prevents the sensitizing dyes from aggregating or agglutinating in the porous semiconductor layer 16A and 16B. The co-adsorbent can be appropriately selected from general materials in this field depending on the sensitizing dye to be combined.

The porous insulation layer 36B includes insulator microparticles 36 and pores 36p. The electrolytic solution 42 infiltrates into the pores 36p of the porous insulation layer 36B and is held therein. The insulator microparticles 36 can be formed from, for example, at least one selected from the group consisting of titanium oxide, niobium oxide, zirconium oxide, silicon oxide such as silica glass and soda glass, aluminum oxide, and barium titanate. As the insulator microparticles 36, it is preferable to use rutile titanium oxide. When rutile titanium oxide is used as the insulator microparticles 36, the rutile titanium oxide preferably has an average particle diameter of 5 nm or more and 500 nm or less, further preferably 10 nm or more and 300 nm or less.

The electrolytic solution 42 may be any liquid (solution) containing a redox couple, and any liquid that can be used in general batteries, dye-sensitized solar cells, or the like can be used without particular limitation. Specifically, the electrolytic solution 42 is, for example, a solution consisting of a redox couple and a solvent that can dissolve the redox couple, a solution consisting of a redox couple and a molten salt that can dissolve the redox couple, or a solution consisting of a redox couple and a solvent and a molten salt that can dissolve the redox couple. The electrolytic solution 42 may contain a gelling agent and be gelated.

The redox couple is, for example, a $I^-/I^{3-}$, $Br^{2-}/Br^{3-}$, $Fe^{2+}/Fe^{3+}$, or quinone/hydroquinone redox couple. More specifically, the redox couple can be a combination of iodine ($I_2$) and a metal iodide such as lithium iodide (LiI), sodium iodide (NaI), potassium iodide (KI), or calcium iodide ($CaI_2$). The redox couple can be a combination of iodine and a tetraalkylammonium salt such as tetraethylammonium iodide (TEAI), tetrapropylammonium iodide (TPAI), tetrabutylammonium iodide (TBAI), or tetrahexylammonium iodide (THAI). The redox couple further may be a combination of bromine and a metal bromide such as lithium bromide (LiBr), sodium bromide (NaBr), potassium bromide (KBr), or calcium bromide ($CaBr_2$). A preferred redox couple is a combination of LiI and $I_2$.

The solvent for the redox couple is preferably, for example, a solvent including at least one selected from the group consisting of carbonate compounds such as propylene carbonate, nitrile compounds such as acetonitrile, alcohols such as ethanol, water, and aprotic polar substances. It is further preferable to use, as the solvent, the carbonate compounds or the nitrile compounds alone or as a mixture.

In some embodiment, a solid electrolyte may be used instead of the electrolyte solution 42. The solid electrolyte contains a metal complex salt. The metal complex salt is composed of a metal cation, a ligand, and an anion, and all the combinations listed below. Specific examples of the metal cation of the metal complex salt for use in the present invention include cations of chromium, manganese, iron, cobalt, nickel, copper, molybdenum, ruthenium, rhodium, palladium, silver, tungsten, rhenium, osmium, iridium, gold, and platinum. Among them, preferred are cations of cobalt, iron, nickel, and copper.

Specific examples of the ligand for constituting the metal complex salt include the following (I) to (V). These may be used alone, or in combination.

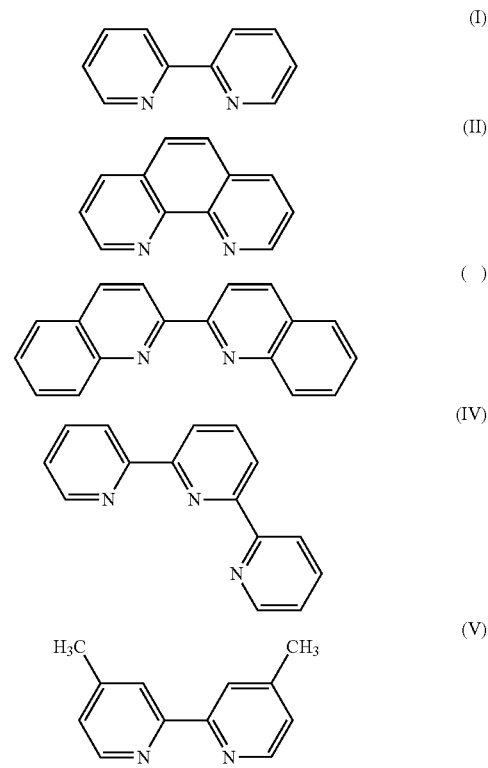

Specific examples of the anion in the metal complex salt include a hydride ion ($H^-$), a fluoride ion ($F^-$), a chloride ion ($Cl^-$), a bromide ion ($Br^-$) an iodide ion ($I^-$), a hydroxide ion ($OH^-$), a cyanide ion ($CN^-$), a nitric acid ion ($NO_3^-$), a nitrous acid ion ($NO_2^-$), a hypochlorous acid ion ($ClO^-$), a chlorous acid ion ($ClO_2^-$), a chloric acid ion ($ClO_3^-$), a perchloric acid ion ($ClO_4^-$), a permanganic acid ion ($MnO_4^-$), an acetic acid ion ($CH3COO^-$), a hydrogencarbonate ion ($HCO_3^-$), a dihydrogen phosphate ion ($H_2PO_4^-$), a hydrogen sulfate ion ($HSO_4^-$), a hydrogen sulfide ion ($HS^-$), a thiocyanic acid ion ($SCN^-$), a tetrafluoroboric acid ion ($BF_4^-$)), a hexafluorophosphate ion ($PF_6^-$), a tetracyanoborate ion ($B(CN)_4^-$), a dicyanoamine ion ($N(CN)_2^-$), a p-toluenesulfonic acid ion ($TsO^-$), a trifluoromethyl sulfonate ion ($CF_3SO_2^-$), a bis(trifluoromethylsulfonyl)amine ion ($N(SO_2CF_3)_2^-$), a tetrahydroxoaluminate ion ($[Al(OH)_4]^-$, or $[Al(OH)_4 (H_2O)_2]^-$), a dicyanoargentate (I) ion ($[Ag(CN)_2]^-$), a tetrahydroxochromate (III) ion ($[Cr(OH)_4]^-$), a tetrachloroaurate (III) ion ($[AuCl_4]^-$), an oxide ion ($O^{2-}$), a sulfide ion ($S^{2-}$), a peroxide ion ($O_2^{2-}$), a sulfuric acid ion ($SO_4^{2-}$), a sulfurous acid ion ($SO_3^{2-}$), a thiosulfuric acid ion ($S_2O_3^{2-}$), a carbonic acid ion ($CO_3^{2-}$), a chromic acid ion ($CrO_4^{2-}$), a d ichromic acid ion ($Cr_2O_7^{2-}$), a dihydrogen phosphate ion ($HPO_4^{2-}$), a tetrahydroxozincate (II) ion ($[Zn(OH)_4]^2$), a tetracyanozincate (II) ($[Zn(CN)_4]^{2-}$), tetrachlorocuprate (II) ion ($[CuCl_4]^{2-}$), a phosphoric acid ion ($PO_4^{3-}$), a hexacyanoferrate (III) ion ($[Fe(CN)_6]^{3-}$), a bis(thiosulfato)argentat (I) ion ($[Ag(SO_2O_3)_2]^{3-}$), and a hexacyanoferrate (II) ion ($[Fe(CN)_6]^{4-}$). Among them, preferred are a tetrafluoroboric acid ion, a hexafluorophosphate ion, a tetracyanoborate ion, a bis(trifluoromethylsulfonyl)amine ion, and a perchloric acid ion.

These metal complex salts may be used alone, or as a mixture of the metal complex salts.

In some embodiments, the solid electrolyte is preferably provided with a plurality of holes penetrating from the porous semiconductor layer 16A to the counter electrode conductive layer 28A. In some embodiments, the solid electrolyte is preferably porous.

In some embodiments, the electrolyte comprises electrolytic solution and solid electrolyte. In some embodiments, the electrolyte further a cyclic compound which is a heterocyclic compound having one or more nitrogen atoms and two or more rings. The heterocyclic compound, for example, is at least one selected from the group consisting of 1-ethyl-3-methylimidazolium bromide, 1-ethyl-3-methylimidazolium hexafluorophosphate, 1-ethyl-3-methylimidazolium tetrafluoroborate, 1-ethyl-3-methylimidazolium tosylate, 1-ethyl-3-methylimidazolium cobalt tetracarbonyl, 1-ethyl-3-methylimidazolium bistrifluoromethane sulfonyl imide, 1-n-hexyl-3-methylimidazolium hexafluorophosphate, 1-n-hexyl-3-methylimidazolium hexafluorophosphate, 1-benzyl-3-methylimidazolium hexafluorophosphate, 1-methyl-3-(3-phenylpropyl)imidazolium hexafluorophosphate, 1-n-hexyl-2,3-dimethylimidazolium hexafluorophosphate, and 1-ethyl-2,3-dimethylimidazolium hexafluorophosphate)" a pyridinium-based ionic liquid, such as N-butylpyridinium bromide, N-butylpyridinium hexafluorophosphate, N-butylpyridinium tetrafluoroborate, N-butylpyridinium tosylate, N-butylpyridinium cobalt tetracarbonyl, and N-butylpyridinium bistrifluoromethane sulfonyl dimide! and a pyrrolidinium-based ionic liquid, such as 1-ethyl-1-methylpyrrolidinium bromide, 1-ethyl-1-methylpyrrolidinium hexafluorophosphate, 1-ethyl-1-methylpyrrolidinium tetrafluoroborate, 1-ethyl-1-methylpyrrolidinium tosylate, 1-ethyl-1-methylpyrrolidinium cobalt tetracarbonyl, and 1-ethyl-1-methylpyrrolidinium bistrifluoromethane sulfonyl dimide.

DSCs 100 and 200 can be produced by a known method, except for the step of adsorbing and supporting a dye to the counter electrode conductive layers 28A and 28B. For example, the DSCs can be produced by the method described in International Publication No. WO2014/038570. Incidentally, the step of adsorbing and supporting a dye to the counter electrode conductive layers 28A and 28B can also be implemented by the same method as a known method for adsorbing and supporting a dye to a porous semiconductor layer.

Figure 3:
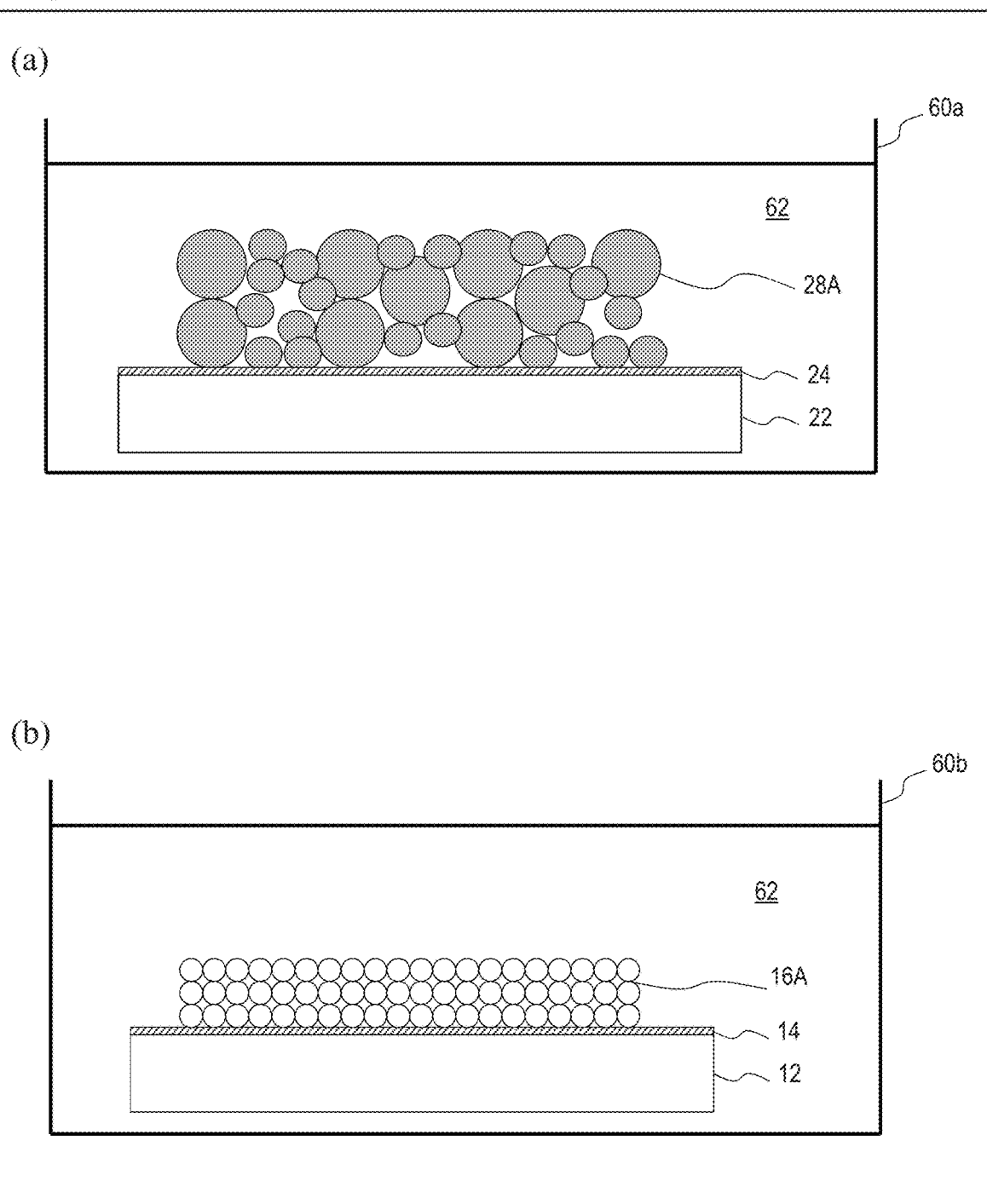
FIG. 3 includes diagrams (a) and (b) for explaining a method for producing DSC 100.

In the method for producing DSC 100, the step of supporting a dye to the counter electrode conductive layer 28A and the porous semiconductor layer 16A is performed by, for example, as shown in FIGS. 3(a) and (b), immersing the substrate 22 provided with the counter electrode conductive layer 28A and the substrate 12 provided with the porous semiconductor layer 16A in a solution 62 containing the dye and leaving them for a predetermined time. Here, although different containers 60a and 60b were prepared for the substrate 22 and the substrate 12, respectively, the substrate 22 and the substrate 12 may be immersed in the same container. In DSC 100, the dye supported by the counter electrode conductive layer 28A and the dye supported by the porous semiconductor layer 16A may be different from each other.

Figure 4:
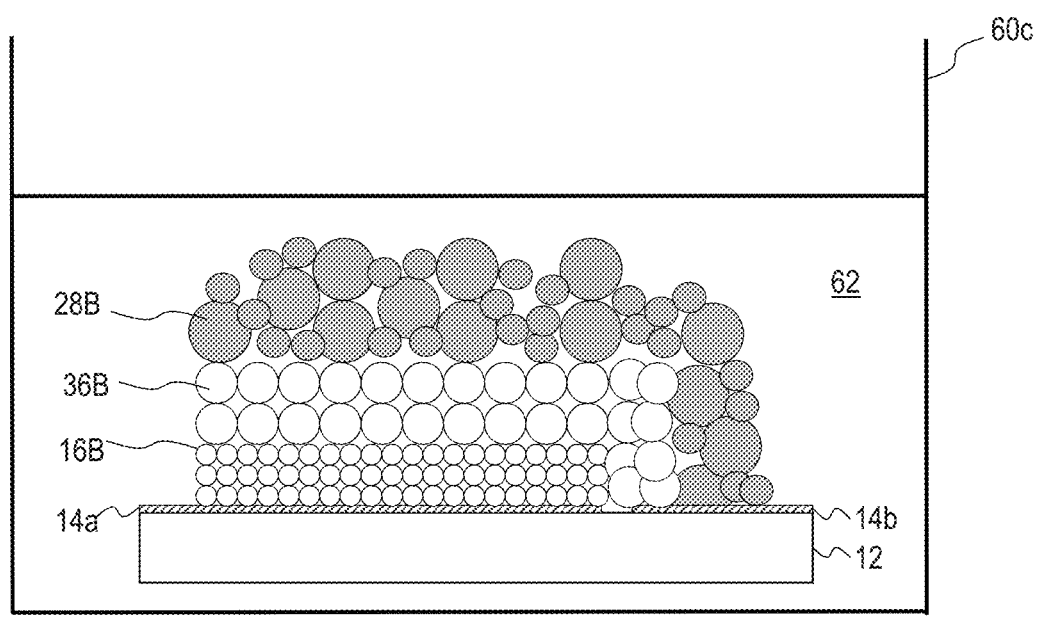
FIG. 4 is a diagram for explaining a method for producing DSC 200.

In the method for producing DSC 200, as shown in FIG. 4, the substrate 12 provided with the porous semiconductor layer 16B and the counter electrode conductive layer 28B is immersed in a solution 62 containing a dye in a container 60c. Accordingly, DSC 200 having a monolithic structure can be produced more simply than DSC 100.

The present disclosure will now be described in more detail by showing experimental examples (Examples 1 to 7 and Comparative Examples 1 to 7).

In the experiments, DSCs 100 and 200 having the following structures were produced.

Transparent substrate 12, 22, transparent conductive layer 14, 14a, 14b, 24: glass substrate provided with FTO layer (TEC A9X), manufactured by Nippon Sheet Glass Company, Ltd., thickness: 4 mm, size: 20 mm×70 mm (70 mm×70 mm in a DSC module), electrical resistivity: 9 Ω/sq;

Substrate 22 (DSC 200): blue plate glass substrate (manufactured by Matsunami Glass Ind., Ltd.), thickness: 1 mm, size: 10 mm×70 mm;

Porous semiconductor layer 16A, 16B: porous titanium oxide, titanium oxide paste D/SP (manufactured by Solaronix SA) was formed into a rectangle of 7 mm×50 mm×24 μm (thickness), electrical resistivity ($10^{-13}$ to $10^{-14}$ mho/cm as a general physical property value), dye A (trade name: Ruthenium 620-1H3 TBA (manufactured by Solaronix SA), the supported amount of dye was changed;

Porous insulation layer 36B: porous zirconium oxide, zirconium oxide paste Zr-Nanoxide Z/SP (manufactured by Solaronix SA) was formed into a rectangular of 7.2 mm×50.2 mm×13 μm;

Counter electrode conductive layer 28A, 28B: the composition of carbon microparticles, the adsorbed amount of dye, and the thickness were appropriately adjusted;

Electrolytic solution 42: $I^{3-}$ concentration: 0.05 M, solvent: acetonitrile, thickness: 50 μm (gap); and Sealing part 52: ultraviolet curing resin (model number: 31X-101 (manufactured by ThreeBond Co., Ltd.)), seal width: 1 mm.

Regarding each sample cell, the amount (mol) of the dye supported by the counter electrode conductive layer and the rate of change in short-circuit current density Jsc (mA/cm$^2$) before and after photoirradiation experiment were determined. The results of Examples are shown in Table 1, and the results of Comparative Examples are shown in Table 2. In the photoirradiation experiment, the rate of change in short-circuit current density Jsc before and after photoirradiation experiment was determined under conditions conforming to JIS C8938 (Appendix A-5, irradiation illuminance on sample surface: 255 W/m$^2$, wavelength range of irradiation light: 300 to 700 nm, black panel temperature: 63° C.) for an irradiation time of 24 h.

The supported amount of a dye was determined as follows. For each sample cell having a DSC 100-type structure (Examples 1 to 3 and Comparative Examples 1 to 4), the substrate 12 provided with a porous semiconductor layer 16A and the substrate 22 provided with a counter electrode conductive layer 28A were each immersed in an alkaline solution to desorb the dye, and the amounts of the dye supported by the porous semiconductor layer 16A and the counter electrode conductive layer 28A were determined from the absorption spectra of the respective solutions containing the dye. For each sample cell having a DSC 200-type structure (Examples 4 to 7 and Comparative Examples 5 to 7), the substrate 12 provided with a porous semiconductor layer 16B, a porous insulation layer 36B, and a counter electrode conductive layer 28B was immersed in an alkaline solution to desorb the dye, and the amount of the dye supported by the porous semiconductor layer 16B and the counter electrode conductive layer 28B was determined from the absorption spectrum of the solution containing the dye. A porous semiconductor layer 16B, a porous insulation layer 36B, and a counter electrode conductive layer 28B were formed on a substrate 12, and the counter electrode conductive layer 28B was scraped off, and the substrate 12 having the porous semiconductor layer 16B and the porous insulation layer 36B was immersed in an alkaline solution to adsorb the dye, and the amount of dye supported by the porous semiconductor layer 16B was determined from the absorption spectrum of the solution containing the dye. Separately, the amount of the dye supported by the porous semiconductor layer 16B and the counter electrode conductive layer 28B was determined, and the amount of the dye supported by the porous semiconductor layer 16B was subtracted therefrom to determine the amount of the dye supported by the counter electrode conductive layer 28B. In Tables 1 and 2, each amount of the dye supported by the counter electrode conductive layer is shown as a ratio (percentage) to the amount of the dye supported by the porous semiconductor layer.

Characteristics of each sample cell of Examples 1 to 7 and Comparative Examples 1 to 7 will be shown below.

Examples 1 to 7, Comparative Examples 1 to 7: porous semiconductor layer: 6 µm, average particle diameter: 20 nm, Examples 1 to 6, Comparative Examples 5 and 6: counter electrode conductive layer: average particle diameter of carbon microparticles: 5.1 µm (⅐ (carbon black, average particle diameter: 30 nm), 6/7 (graphite microparticles, average particle diameter: 6 µm)), Examples 1 to 3: DSC 100-type, counter electrode conductive layer: 24 µm, supported amount of dye was changed (immersion time in dye solution: 4 hours, 8 hours, and 16 hours), Comparative Examples 1 to 4: DSC 100-type, counter electrode conductive layer: 24 µm, supported amount of dye was changed using carbon microparticles (graphite particles having an average particle diameter of 2 µm) having low adsorption capacity for dye (immersion time in dye solution: 24 hours, 12 hours, and 6 hours), Examples 4 to 6: DSC 200-type, thickness of counter electrode conductive layer: 24 µm, 42 µm, and 80 µm, Comparative Examples 5, 6: DSC 200-type, thickness of counter electrode conductive layer: 18 µm, 90 µm, Example 7: DSC 200-type, thickness of counter electrode conductive layer: 24 µm, average particle diameter of carbon microparticles: 3.1 µm (½ (carbon black, average particle diameter: 40 nm), ½ (graphite microparticles, average particle diameter: 5 µm)), Comparative Example 7: DSC 200-type, thickness of counter electrode conductive layer: 24 µm, average particle diameter of carbon microparticles: 1.7 µm (⅓ (carbon black, average particle diameter: 40 nm), ⅔ (graphite microparticles, average particle diameter: 5 µm)).

The average particle diameters of the carbon black and graphite microparticles contained in a counter electrode conductive layer are arithmetic mean particle diameters determined from a transmission electron microscope (TEM) image of a cross-sectional surface of the counter electrode conductive layer of each of the cells of Examples 1 to 6 and Comparative Examples 1 to 7 cut out with a glass cutting machine.

Figure 5:
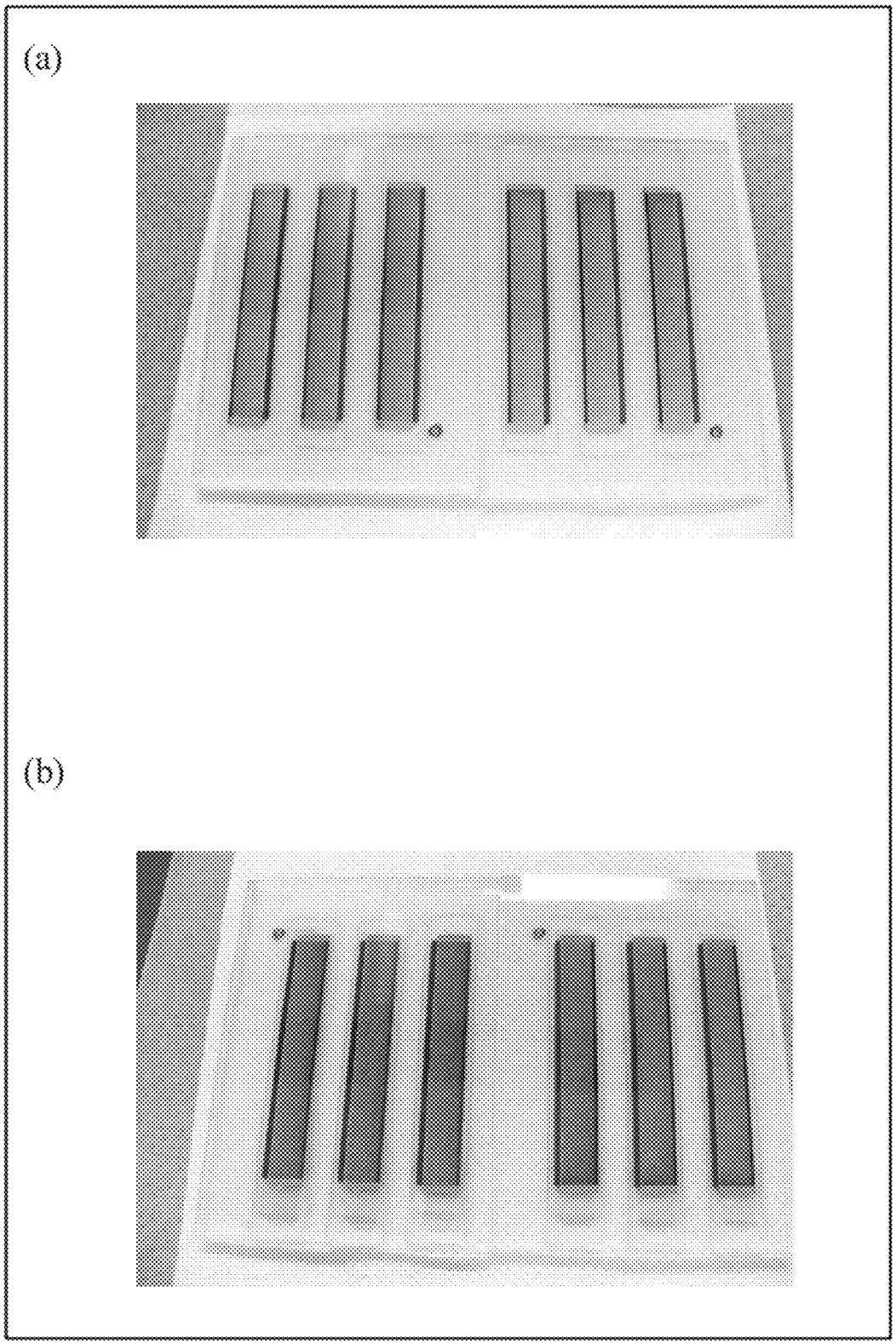
FIG. 5 includes optical images (a) and (b) of samples after photoirradiation experiments, the optical image (a) is of a sample cell of Comparative Example 1 and the optical image (b) is of a sample cell of Example 1.

Sample cells of Comparative Example 1 in which the counter electrode conductive layer does not support a dye and of Example 1 in which the counter electrode conductive layer supports a dye were compared with each other. FIGS. 5(a) and (b) show optical images of the samples after the photoirradiation experiment. FIG. 5(a) is an optical image of the sample cell of Comparative Example 1, and FIG. 5(b) is an optical image of the sample cell of Example 1. Comparison between FIG. 5(a) and FIG. 5(b) demonstrates that the sample cell of Example 1 is prevented from decoloring compared to the sample cell of Comparative Example 1. In addition, as shown in Tables 1 and 2, the Jsc change rate of the sample cell of Example 1 was −9.0%, whereas the Jsc change rate of the sample cell of Comparative Example 1 was −21%, it is demonstrated that a decrease in the short-circuit current density Jsc due to desorption of the dye from the porous semiconductor was prevented.

The rates of change in short-circuit current density Jsc of the sample cells of Examples 2 and 3 and the sample cells of Comparative Examples 2 to 4 were as follows. The rates of change in short-circuit current density Jsc of the sample cells of Examples 2 and 3 were each larger than −10.0% (the absolute value of a rate of change is 10% or less) to prevent the short-circuit current density Jsc from decreasing, whereas the rates of change in the short-circuit current density Jsc of the sample cells of Comparative Examples 2 to 4 were each less than −10.0% (the absolute value of a rate of change is larger than 10%). In addition, the effect of preventing the decrease in short-circuit current density Jsc increases as the amount of the dye supported by the counter electrode conductive layer. Among Examples 1 to 3, the amount of the dye supported by the counter electrode conductive layer of the sample of Example 3, which showed the largest decrease in short-circuit current density Jsc (the Jsc change rate was −9.6%), was 25%. Accordingly, it can be said that the absolute value of the Jsc change rate can be controlled to 10% or less by controlling the amount (number of moles) of the dye supported by the counter electrode conductive layer to be 25% or more of the amount (number of moles) of the dye supported by the porous semiconductor layer. In contrast, the amount (number of moles) of the dye supported by the counter electrode conductive layer is preferably less than 170%.

A preferable thickness of the counter electrode conductive layer was examined using sample cells having the DSC 200-type structure. As shown in Table 1, the absolute values of the Jsc change rates of the sample cells of Examples 4 to 6 in which the thicknesses of the counter electrode conductive layers were, respectively, 24 µm, 42 µm, and 80 µm were all 10% or less. In contrast, the absolute value of the Jsc change rate of the sample cell of Comparative Example 5 in which the thickness of the counter electrode conductive layer was 18 µm was very large, 25%. In addition, the absolute value of the Jsc change rate of the sample cell of Comparative Example 6 in which the thickness of the counter electrode conductive layer was 90 µm was very small, 3%, and the initial short-circuit current density Jsc before the photoirradiation experiment was also small, 0.051 mA/cm$^2$. This, as described with reference to FIG. 4, when a dye is adsorbed to the counter electrode conductive layer 28B and the porous semiconductor layer 16B, the adsorption of the dye to the porous semiconductor layer 16B becomes difficult as the thickness of the counter electrode conductive layer 28B increases. As in the sample cell of Comparative Example 6, if the thickness of the counter electrode conductive layer 28B is 90 µm or more, a sufficient amount of the dye cannot be adsorbed to the porous semiconductor layer 16B, and as a result, a sufficient short-circuit current cannot be obtained. These results suggest that a preferable thickness of the counter electrode conductive layer is 24 µm or more and 80 μm or less. However, the upper limit of the thickness of the counter electrode conductive layer also depends on how to adsorb the dye and the structure of the counter electrode conductive layer, so it can exceed 80 μm.

In Example 7 and Comparative Example 7, influences of the composition (mixture) of carbon microparticles constituting the counter electrode conductive layer was investigated.

In the sample cell of Example 7, the carbon microparticles (average particle diameter: 3.1 μm (½ (carbon black, average particle diameter: 40 nm), ½ (graphite microparticles, average particle diameter: 5 μm))) used were those having a higher adsorption capacity for the dye than the sample cell of Example 4. As indicated in Table 1, the amount of the dye supported by the counter electrode conductive layer in the sample cell of Example 7 was larger than that of the dye supported by the counter electrode conductive layer in the sample cell of Example 4, and as a result, the absolute value of the Jsc change rate in the sample cell of Example 7 was 5.0%, less than the absolute value, 9.8%, of the Jsc change rate in the sample cell of Example 4.

In the sample cell of Comparative Example 7, carbon microparticles (average particle diameter: 1.7 μm ((carbon black, average particle diameter: 40 nm)>(graphite microparticles, average particle diameter: 5 μm))) having a further higher adsorption capacity were used. As a result, although the absolute value of the Jsc change rate was further decreased to 3.0%, the initial conversion efficiency was decreased by 10%. This is because when the amount of the dye supported by the counter electrode conductive layer is excessive, the internal resistance of the counter electrode conductive layer (the resistance of the electron transfer reaction in the counter electrode conductive layer) increases. Table 3 shows the measurement results of AC impedance in the opposing conductive layer. The AC impedance was measured with a measurement apparatus manufactured by Autolabo by connecting the working electrode to the positive electrode of the cell and the counter electrode and reference electrode to the negative electrode, with an amplitude of 10 mV from 0.1 Hz to 10 MHz at open voltage conditions and irradiation with solar simulator light of 10 mW/cm$^2$. As shown in Table 3, the AC impedance of the counter electrode conductive layer in Comparative Example 7 was large, five-times the AC impedance in Example 7. Based on these results, it is preferable that the amount (number of moles) of the dye supported by the counter electrode conductive layer is less than 170% of the amount (number of moles) of the dye supported by the porous semiconductor layer. For that purpose, it can be said that it is preferred that the carbon microparticles constituting the counter electrode conductive layer have an average particle diameter of larger than 2 μm and 5 μm or less.

TABLE 1

|  | Porous semiconductor layer supported dye amount A | Counter electrode conductive layer supported dye amount B | B/A percentage | Initial Jsc [mA/cm$^2$] | Jsc change rate |
| --- | --- | --- | --- | --- | --- |
| Example 1 | 7.50E−08 | 2.50E−08 | 33.3% | 0.091 | −9.0% |
| Example 2 | 9.30E−08 | 2.70E−08 | 29.0% | 0.095 | −9.5% |
| Example 3 | 1.12E−07 | 2.80E−08 | 25.0% | 0.101 | −9.6% |
| Example 4 | 5.60E−08 | 2.50E−08 | 44.6% | 0.089 | −9.8% |
| Example 5 | 5.90E−08 | 3.10E−08 | 52.5% | 0.088 | −8.0% |
| Example 6 | 4.50E−08 | 3.50E−08 | 77.8% | 0.087 | −8.0% |
| Example 7 | 5.10E−08 | 3.60E−08 | 70.6% | 0.890 | −5.0% |

TABLE 2

|  | Porous semiconductor layer supported dye amount A | Counter electrode conductive layer supported dye amount B | B/A percentage | Initial Jsc [mA/cm$^2$] | Jsc change rate |
| --- | --- | --- | --- | --- | --- |
| Comparative Example 1 | 1.10E−07 | 0.00E+00 | 0.0% | 0.089 | −21% |
| Comparative Example 2 | 1.10E−07 | 2.20E−08 | 20.0% | 0.093 | −13% |
| Comparative Example 3 | 1.10E−07 | 1.50E−08 | 13.6% | 0.093 | −15% |
| Comparative Example 4 | 1.10E−07 | 1.00E−08 | 9.1% | 0.092 | −18% |
| Comparative Example 5 | 1.10E−07 | 1.20E−08 | 12.0% | 0.091 | −25% |
| Comparative Example 6 | 1.22E−08 | 1.00E−07 | 819.7% | 0.051 | −3% |
| Comparative Example 7 | 4.92E−08 | 8.45E−08 | 171.7% | 0.081 | −3% |

TABLE 3

| | Resistance of the electron transfer reaction in the counter electrode conductive layer in AC impedance measurement |
|---|---|
| Example 7 | 10 Ω |
| Comparative Example 7 | 50 Ω |

Thus, according to the embodiments of the present disclosure, a dye-sensitized solar cell in which a decrease in the short-circuit current due to desorption of the dye from a porous semiconductor is prevented and a method for producing the dye-sensitized solar cell are provided.

INDUSTRIAL APPLICABILITY

The embodiments of the present disclosure can be widely applied to known dye-sensitized solar cells and methods for producing such solar cells.

DESCRIPTION OF THE INCORPORATED

This application claims the priority based on Japanese Patent Application No. 2016-158766, filed on Aug. 12, 2016, all of the disclosure of which is incorporated herein.

REFERENCE SIGNS LIST 12, 22 substrate
14 transparent conductive layer
14a transparent conductive layer
14b transparent conductive layer
16 semiconductor microparticles
16A porous semiconductor layer
16B porous semiconductor layer
16p pore
24 transparent conductive layer
28A counter electrode conductive layer
28B counter electrode conductive layer
28L microparticle
28S microparticle
28p pore
36 insulator microparticle
36B porous insulation layer
36p pre
42 electrolytic solution
52 sealing part
60a, 60b, 60c container
100, 200 dye-sensitized solar cell (DSC)

The invention claimed is:

1. A dye-sensitized solar cell comprising:
 a first electrode including a porous semiconductor layer supporting a dye; and
 a second electrode serving as a counter electrode of the first electrode; wherein
 the second electrode includes a counter electrode conductive layer containing carbon microparticles supporting a dye that is the same as or different from the dye supported by the porous semiconductor layer.

2. The dye-sensitized solar cell according to claim 1, further comprising:
 an electrolyte arranged between the porous semiconductor layer and the second electrode.

3. The dye-sensitized solar cell according to claim 2, further comprising:
 the electrolyte contains metal complex salt.

4. The dye-sensitized solar cell according to claim 2, further comprising:
 the metal complex salt is composed of:
 a metal cation being one or more selected from a group consisting of chromium cation, manganese cation, iron cation, cobalt cation, nickel cation, copper cation, molybdenum cation, ruthenium cation, rhodium cation, palladium cation, silver cation, tungsten cation, rhenium cation, osmium cation, iridium cation, gold cation, and platinum cation,
 a ligand, and
 an anion.

5. The dye-sensitized solar cell according to claim 1, wherein
 the second electrode includes the counter electrode conductive layer containing the carbon microparticles and supporting the dye that is the same as the dye supported by the porous semiconductor layer.

6. The dye-sensitized solar cell according to claim 2, wherein
 the electrolyte contains a cyclic compound which is a heterocyclic compound having one or more nitrogen atoms and two or more rings.

* * * * *